US012760412B2

(12) United States Patent
Pool

(10) Patent No.: US 12,760,412 B2
(45) Date of Patent: Oct. 13, 2026

(54) NOZZLE FOR REMOTE PLASMA CLEANING OF PROCESS CHAMBERS

(71) Applicant: Lam Research Corporation, Fremont, CA (US)

(72) Inventor: Jeremy Jerome Pool, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 279 days.

(21) Appl. No.: 18/550,940

(22) PCT Filed: Mar. 17, 2022

(86) PCT No.: PCT/US2022/020734
§ 371 (c)(1),
(2) Date: Sep. 15, 2023

(87) PCT Pub. No.: WO2022/197915
PCT Pub. Date: Sep. 22, 2022

(65) Prior Publication Data

US 2024/0141482 A1 May 2, 2024

Related U.S. Application Data

(60) Provisional application No. 63/163,694, filed on Mar. 19, 2021.

(51) Int. Cl.
*C23C 16/44* (2006.01)
*C23C 16/455* (2006.01)
(Continued)

(52) U.S. Cl.
CPC .... *C23C 16/4405* (2013.01); *C23C 16/45565* (2013.01); *C23C 16/4583* (2013.01);
(Continued)

(58) Field of Classification Search
CPC .......... C23C 16/4405; C23C 16/45565; C23C 16/4583; C23C 16/45563;
(Continued)

(56) References Cited

U.S. PATENT DOCUMENTS 5,643,394 A 7/1997 Maydan et al.
5,954,877 A 9/1999 Hayes
(Continued)

FOREIGN PATENT DOCUMENTS

JP H05168982 A 7/1993
JP 2001181843 A 7/2001
(Continued)

OTHER PUBLICATIONS

International Preliminary Report on Patentability dated Sep. 28, 2023, in PCT Application No. PCT/US2022/020734.
(Continued)

*Primary Examiner* — Rudy Zervigon
(74) *Attorney, Agent, or Firm* — Weaver Austin Villeneuve & Sampson LLP

(57) ABSTRACT

Nozzles for providing gas into a semiconductor wafer process chamber are disclosed. The nozzles may include a deflector structure that has a surface facing the nozzle outlet so as to redirect gas as it enters a chamber. The nozzles may also have a cooling system to remove heat provided to the deflector structure through the flow of plasma through the nozzle. The deflector structure may be used to distribute the plasma flowed therethrough in a more evenly distributed manner, thereby protecting hardware within the process chamber from potential hotspots. This has the further effect of redirecting gases more efficiently throughout the chamber.

20 Claims, 10 Drawing Sheets

(51) Int. Cl.

| | |
|---|---|
| ***C23C 16/458*** | (2006.01) |
| ***H01J 37/32*** | (2006.01) |
| ***H10P 72/00*** | (2026.01) |

(52) U.S. Cl.
CPC .. *H01J 37/32357* (2013.01); *H01J 37/32623* (2013.01); *H01J 37/32862* (2013.01); *H01J 37/32899* (2013.01); *H10P 72/00* (2026.01); *H01J 2237/002* (2013.01)

(58) Field of Classification Search
CPC ......... C23C 16/45591; C23C 16/45561; H01J 37/32357; H01J 37/32623; H01J 37/32862; H01J 37/32899; H01J 2237/002; H01J 37/3244; H01J 37/32449; H01J 37/32853; H10P 72/00
USPC ........................ 118/715; 156/345.33, 345.34
See application file for complete search history.

(56) References Cited

U.S. PATENT DOCUMENTS 6,489,043 B1 12/2002 Deevi et al.
8,821,641 B2 * 9/2014 Lee .................. C23C 16/45508 118/728
2012/0100292 A1 * 4/2012 Park .................... C23C 16/4584 118/725
2013/0084391 A1 * 4/2013 Lee .................. C23C 16/45508 239/290
2016/0329191 A1 11/2016 Sieber et al.
2020/0152431 A1 5/2020 Lee et al.
2025/0006514 A1 * 1/2025 Premakumar ..... H01J 37/32449

FOREIGN PATENT DOCUMENTS

JP 2001520463 A 10/2001
JP 2008538256 A 10/2008
JP 2018074145 A 5/2018
TW 200943411 A 10/2009
WO WO-2006065740 A2 6/2006

OTHER PUBLICATIONS

International Search Report and Written Opinion dated Jun. 30, 2022, in PCT Application No. PCT/US2022/020734.
JP Office Action dated Jan. 6, 2026 in JP Application No. 2023556913, with English Translation.
TW Office Action and Search Report dated Aug. 11, 2025 in TW Application No. 111110023, with English Translation.
JP Office Action dated Aug. 4, 2026 in JP Application No. 2023-556913, with English Translation.

* cited by examiner

NOZZLE FOR REMOTE PLASMA CLEANING OF PROCESS CHAMBERS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

In semiconductor wafer processing, some process chambers may be used for deposition of gases onto a substrate, e.g. a semiconductor wafer. During the deposition process, gases may be deposited onto the semiconductor wafer via a showerhead. While the gases are deposited onto the semiconductor wafer, gases may flow to other areas of the chamber, often depositing a film on the chamber's interior surfaces. To remove the film, a chamber may undergo a remote plasma clean. During the remote plasma clean process, a nozzle may be used to flow a hot plasma into the chamber. The nozzle may be fluidically connected with a gas source and a plasma generator, the plasma generator fluidically interposed between the gas source and the nozzle. The nozzle may be mounted towards the center of the process chamber and may flow the plasma into the chamber at a high velocity. Generally, the plasma is concentrated when initially entering the chamber and disperses throughout the chamber after hitting an interior surface of the chamber.

SUMMARY

In some implementations, an apparatus may be provided that includes a nozzle body having a nozzle outlet, a deflector structure, and one or more elongate supports. The one or more elongate supports may be configured to support the deflector structure relative to the nozzle body and the deflector structure may have a deflection surface facing the nozzle outlet. Additionally, a center axis of the nozzle outlet may intersect with the deflection surface, a first cooling passage may extend through at least one of the one or more elongate supports, a second cooling passage may extend through at least one of the one or more elongate supports, and the deflector structure may have one or more hollow interior regions that are fluidically connected with, and fluidically interposed between, the first cooling passage and the second cooling passage.

In some implementations of the apparatus, the deflection surface may include, at least in part, a conical frustum surface.

In some such implementations of the apparatus, the conical frustum surface may be axially symmetric about the center axis of the nozzle outlet.

In some implementations of the apparatus, the one or more hollow interior regions may be bounded in part by an interior surface of the deflector structure that is offset from the deflection surface so that the closest distance between the deflection surface and the interior surface at points distributed across the interior surface is substantially the same.

In some implementations of the apparatus, the one or more hollow interior regions may include one or more passages that are each fluidically connected with, and fluidically interposed between, the first cooling passage and the second cooling passage.

In some implementations of the apparatus, the one or more passages may follow a serpentine path between the first cooling passage and the second cooling passage.

In some implementations of the apparatus, the one or more hollow interior regions may include a hollow interior region with a substantially circular cross-sectional shape in a plane perpendicular to the center axis.

In some implementations of the apparatus, at least one of the one or more hollow interior regions may have a plurality of posts within it, each post connecting to a first interior surface of the hollow interior region.

In some implementations of the apparatus, the one or more elongate supports may include a first elongate support and a second elongate support, the first cooling passage being in the first elongate support, and the second cooling passage being in the second elongated support.

In some implementations of the apparatus, there may be only a single elongate support, the first cooling passage and the second cooling passage are in the single elongate support, and the single elongate support is centered about the center nozzle axis.

In some implementations of the apparatus, the apparatus may further include a process chamber, a plurality of semiconductor wafer processing stations, and an indexer. The semiconductor wafer processing stations may be located within the process chamber, the nozzle body may be supported by a top cover of the process chamber and configured so that the nozzle outlet and deflector structure are located within the process chamber, the deflector structure may be located above the indexer through a center axis of the process chamber that intersects with the top cover of the process chamber, and each of the wafer processing stations may be arranged in the process chamber around the nozzle outlet. The wafer processing stations may each have a pedestal and a showerhead. The pedestals may each have a substrate support surface configured to support a semiconductor wafer when the semiconductor wafer is placed thereupon, and each showerhead may be positioned above one of the pedestals and configured to distribute gases flowed therethrough towards that pedestal.

In some implementations of the apparatus, the indexer may be mounted so that at least part of the indexer is within a central area of the chamber as viewed from above.

In some implementations of the apparatus, the one or more elongate supports may include a first elongate support, a second elongate support, a third elongate support, and a fourth elongate support, In some such implementations of the apparatus, each of the four elongate supports may be a first distance from the center axis and equidistant from each nearest elongate support.

In some implementations of the apparatus, the apparatus may have a third cooling passage and a fourth cooling passage. The first cooling passage may be in the first elongate support, the second cooling passage may be in the second elongate support, the third cooling passage may be in the third elongate support, the fourth cooling passage may be in the fourth elongate support, and the third cooling passage and the fourth cooling passage may be fluidically connected to at least one of the one or more hollow interior regions of the deflector structure.

In some implementations of the apparatus, the nozzle body may be oriented such that each elongate support lies along a corresponding reference axis that intersects the center axis of the nozzle outlet and does not overlap with any of the wafer stations when viewed from above.

In some implementations of the apparatus, the apparatus may have a reference axis passing through the center axis and coincident with the conical frustum surface and which comes within 3 inches of any portion of the center hub of the indexer.

In some implementations of the apparatus, the apparatus may have a reference axis passing through the center axis and coincident with the conical frustum surface and which intersects with the substrate support surface of one of the wafer processing stations and does not intersect with the showerhead of one of the wafer processing stations.

In some implementations of the apparatus, the elongate supports and deflector structure may fit within a cylindrical envelope that is centered on the center axis and has an outer diameter that is no larger than a maximum dimension of the nozzle body at the nozzle outlet and transverse to the center axis.

In some implementations of the apparatus, the apparatus may have a deflector extension structure having an extension surface and the deflector extension structure may be attached to the deflector structure so that the extension surface aligns with the deflection surface to form a single continuous surface.

In some implementations of the apparatus, the extension surface may be concave.

BRIEF DESCRIPTION OF DRAWINGS

The various implementations disclosed herein are illustrated by way of example, and not by way of limitation, in the figures of the accompanying drawings, in which like reference numerals refer to similar elements.

FIGS. 2-1 and 2-2 depict a perspective view of an example of a nozzle and a detailed view of a deflector structure that is an example of the nozzles and deflector structures discussed herein.

FIGS. 4-1 through 4-3 depict various views of different deflector structures.

DETAILED DESCRIPTION

Figure 1:
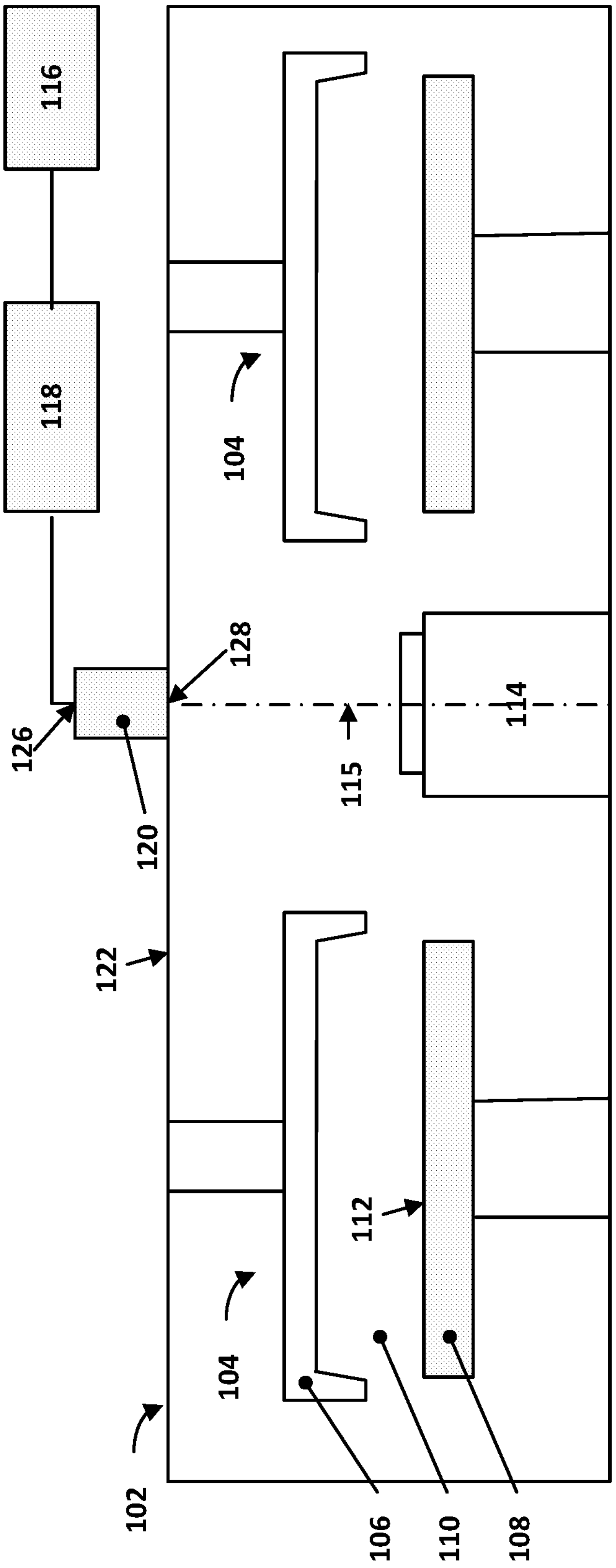
FIG. 1 depicts a side view of part of an example semiconductor processing tool having a nozzle according to the present disclosure.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

During semiconductor wafer processing, process gasses are used to deposit thin films onto substrates, e.g., a semiconductor wafer. Gases may be deposited using chemical vapor deposition (CVD), atomic layer deposition (ALD), or other process in a processing chamber. The processing chamber may have wafer processing stations. In some embodiments, the wafer processing station may be a single station. In some other embodiments, the wafer processing station may have multiple wafer processing stations. Each wafer processing station may have its own showerhead and pedestal. During deposition, gases are flowed from the showerhead onto the substrate. The gases, in addition to being deposited on the substrate, may be deposited onto interior surfaces of the processing chamber leaving a residue. This residue may cause substrates to become contaminated with residue during subsequent processing, e.g., due to flaking or release of other particulates from the residue; the residue may also start to interfere with the operation of other elements of the semiconductor processing chamber.

To prevent such issues, cleaning methods may be used to remove residue inside the processing chamber. One cleaning method is a remote plasma clean, where a plasma is flowed into the processing chamber via a nozzle. The plasma reacts with the residue on the interior surfaces of the chamber, removing the residue and cleaning the processing chamber. When the plasma is flowed into the chamber, the plasma is at a high temperature, e.g., enough to heat components that are directly impinged upon by the plasma to temperatures above 300° C., and enters as a concentrated collimated high-velocity flow. The high velocity flow coupled with a concentration of high temperature plasma may result in damage to hardware directly in line with the flow of the gas, such as a rotational indexer that may be located directly beneath the nozzle. For example, such hardware can deteriorate and shed particles into the chamber. In another example, the hardware may become overheated, giving rise to problems with thermal expansion, material deformation, melting, and other mechanical failures. The potential for such damage was realized when the present assignee of this application developed a new type of rotational indexer with a kinematic linkage system that allowed the wafers supported by the indexer to be rotated relative to the indexer arms. Such a rotational indexer is described in U.S. Pat. No. 10,109,517, which is hereby incorporated herein by reference in its entirety. Having developed this new rotational indexer, the present assignee started exploring its use in various types of semiconductor processing tools and determined that, due to its construction, it was potentially more susceptible to thermal attack than traditional indexers (which do not feature the ability to rotate the wafers relative to the indexer arms). For example, due to the kinematic linkage in the new type of rotational indexers, the center of the indexer featured various moving parts that are covered by a thin cover plate that is less able to shed heat effectively. In contrast, a typical rotational indexer generally has a large, solid central hub that can act as a large heat sink and that is able to quickly conduct heat away from the center of the hub. While the lower heat transfer performance of the cover plate in the newer type of rotational indexer is generally not an issue, it was found to potentially be problematic under certain conditions, e.g., during plasma cleaning operations such as those discussed herein To reduce damage to the chamber's hardware, such as the indexer, a nozzle was designed with a deflector structure feature that reduces the heat load on such hardware. The deflector structure feature is attached to the nozzle body and sits in front of the nozzle outlet. When the nozzle flows plasma into the feature, the flow of gas hits the deflector structure and disperses throughout the chamber, thereby reducing the velocity of the plasma flow and the concentration of plasma. Thereby reducing any unnecessary force and concentration of heat on any single piece of hardware in the process chamber.

Shown in FIG. 1 is a processing chamber 102 which may be used during a deposition process. Within the processing chamber 102, there may be wafer processing stations 104. The wafer processing stations 104 each may have a showerhead 106 and a pedestal 108. The pedestal 108 may have a substrate support surface 112 configured to support a semiconductor wafer (not shown) when the semiconductor wafer is placed thereupon. The showerhead 106 may be positioned above the pedestal 108 and fluidically connected to one or more gas sources. In between the showerhead and the pedestal is a wafer processing area 110. The showerhead 106 may be configured to distribute gases through the processing area 110 to the pedestal 108. For example, during a deposition process, the showerhead will flow gases into the processing area 110 onto a semiconductor wafer supported by the substrate support surface 112. The process chamber may also have a semiconductor wafer handler, such as an indexer 114. After a semiconductor wafer has finished at a wafer processing station 104, the indexer 114 may be used to transfer the semiconductor wafer to a second wafer processing station 104. In some embodiments, the processing chamber 102 may have four wafer processing stations 104. The wafer processing stations may be arranged in a radial or circular array about a center axis 115 which the indexer 114 may be centered on and configured to rotate about. The indexer 114 may have a plurality of indexer arms (not pictured), each with a wafer support on the distal end. The indexer 114 may be used to transfer substrates from one wafer processing station 104 to the next. The indexer 114 may transfer multiple semiconductor wafers from each wafer's current wafer processing station 104 to each wafer's next wafer processing station 104 simultaneously.

The chamber 102 may have a nozzle 120 connected via a chamber lid 122 so that the nozzle discharges into an interior volume of the chamber so as to deliver plasma into the chamber interior. The nozzle 120 may have a nozzle inlet 126 and a nozzle outlet 128. The nozzle 120 may be fluidically connected to gas source 116. The gas source, as an example, may provide a gas such as oxygen ($O_2$), nitrogen trifluoride ($NF_3$), or argon (Ar). Fluidically interposed between the nozzle 120 and the gas source 116 may be a plasma generator 118. In one embodiment, the plasma generator 118 may be a RF plasma generator.

The chamber 102 may become contaminated during wafer processing, such as during a deposition process. During deposition, a showerhead 106 may flow gas through the wafer processing area 110 down on to the semiconductor wafer placed on a substrate support surface 112. Excess gas may flow throughout the chamber 102, including onto other parts of the wafer processing station 104, including on the pedestal 108, as well as to other areas of the processing chamber 102, such as the interior walls and the indexer 114, leaving a film inside the chamber. After the film builds up, the chamber 102 may be cleaned using a remote plasma clean.

During a remote plasma clean, a plasma may be created by flowing a gas from a gas source 116 through a plasma generator 118. The generated plasma may be at a high temperature, e.g., as discussed earlier. The generated plasma is provided to a nozzle 120 to be flowed into the processing chamber 102. In this example, shown in FIG. 1, the nozzle 120 is mounted so that the nozzle outlet 128 is inside the processing chamber 102. The nozzle 120 is mounted to the chamber lid 122 and is centered on the center axis 115 and configured so that a nozzle outlet 128 is facing directly towards the indexer 114. The plasma is provided to the nozzle 120 to be flowed into the processing chamber 102 to react with film left in the chamber 102. The high temperature plasma may enter the chamber 102 in a high velocity collimated flow. The collimated stream of plasma may impinge on hardware in the chamber directly below nozzle outlet before dispersing throughout the chamber 102. In the example shown in FIG. 1, the collimated high velocity plasm gas will hit the indexer 114 directly. After making contact with the indexer 114, the plasma will disseminate throughout the chamber, travelling through the processing wafer stations 104, reacting with any unreacted film inside, cleaning the process chamber.

Having a collimated plasma at a high temperature hit hardware at a high velocity may cause some issues for both the hardware in direct contact with the collimated plasma and the process chamber where the hardware sits. For example, in FIG. 1, the high velocity plasma flow will hit the indexer 114. This may cause deterioration of the hardware, particularly to the indexer's cover, which makes contact with the gas. This deterioration of the hardware may generate particles able to disseminate throughout the chamber, thus, risking further contamination of the processing chamber 102 and subsequent semiconductor wafers processed in the chamber. In addition, the hardware will heat and may become overheated without a proper heatsink. For example, as discussed above, typical indexers were designed with solid center hubs. The centers hubs had enough mass and thermal conductivity to absorb the heat from the plasma and efficiently remove the heat from the system. However, due to the kinematic links in the newer indexer, the solid hub was replaced by a more complex, movable mechanism having a thin metal cover, thus reducing the indexer's ability to remove heat delivered to the center of the indexer. Continuing with the embodiment shown in FIG. 1, the indexer 114 may overheat causing several potential issues with the assembly. For example, the heat from the plasma, when flowed directly on to the thin metal cover, may cause the cover to melt, damaging the cover. Since the indexer's components are made of different materials, the expansion coefficient of the materials may be different, thus, when the indexer heats, the components may expand at different rates, causing fit issues. Some materials, such as aluminum, may soften, causing screws mounted to the aluminum to become loose, and potentially causing issues with the indexer. The present inventor realized that a nozzle 120 which could deflect the incoming plasma stream so as to prevent it from focusing on a particular point on the indexer while still, itself, remaining sufficiently cool enough to prevent the nozzle itself from overheating would help mitigate the above issues.

Figure 2:
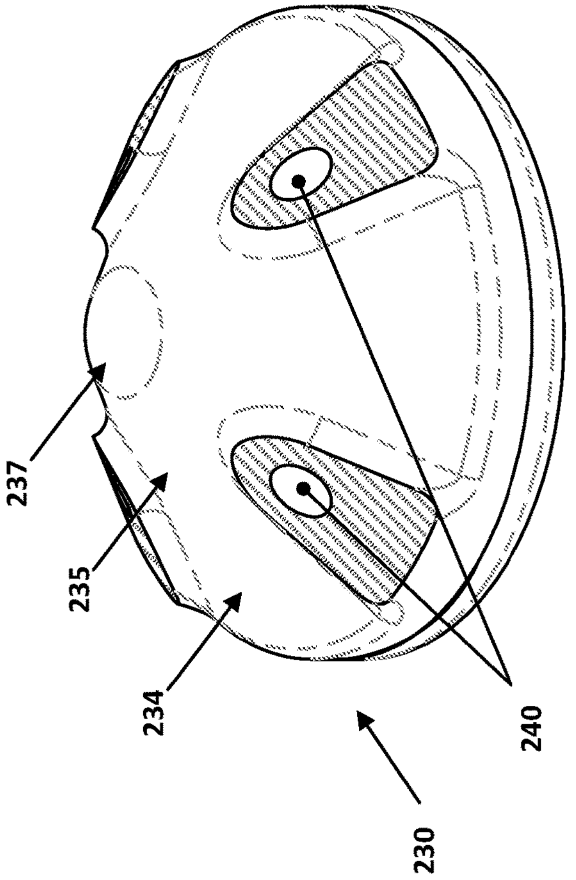
Figures 1, 2:
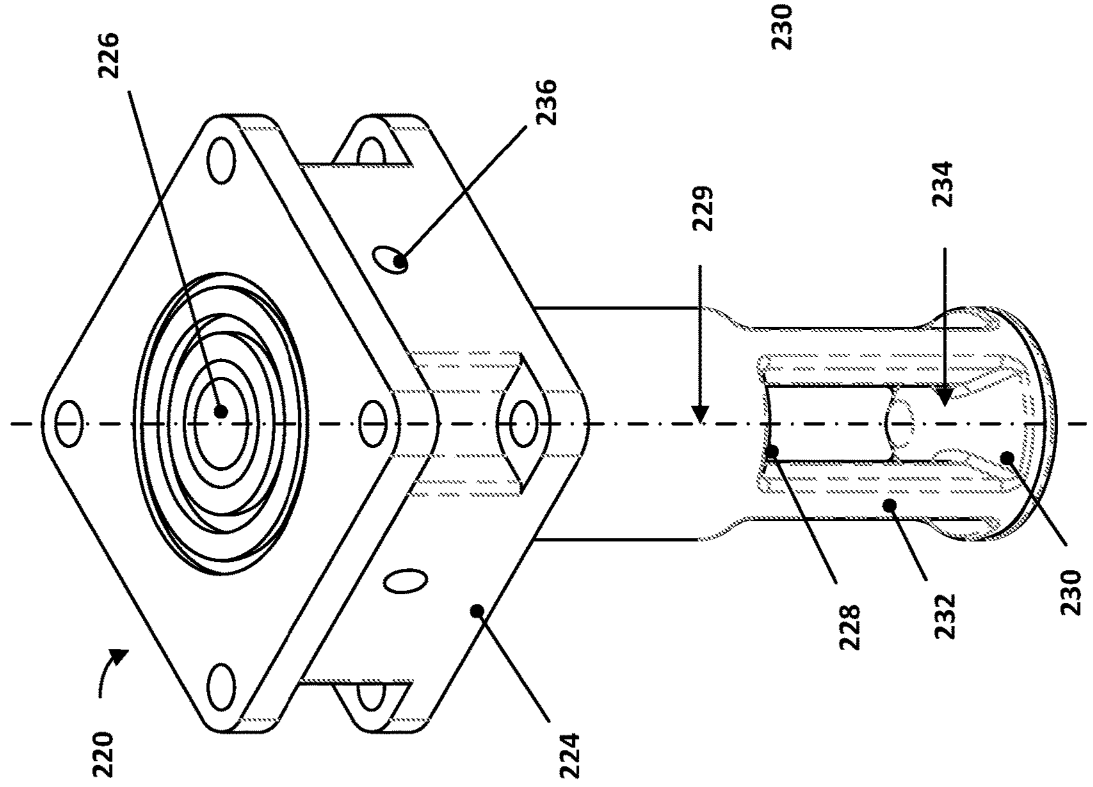

Shown in FIG. 2-1 is a nozzle 220 which may be used to minimize the impact of a high-intensity plasma flow into a processing chamber. FIG. 2-2 shows a close up of the deflector structure of the nozzle of FIG. 2-1 with the remainder of the nozzle cut away. The nozzle 220 has a nozzle body 224. The nozzle body includes a nozzle inlet 226 to receive plasma and a nozzle outlet 228 to eject the plasma. The nozzle, through the nozzle inlet 226, is fluidically connected to a plasma source which provides the plasma to the nozzle. The plasma is expelled through the nozzle outlet 228.

The nozzle 220 has a deflector structure 230 attached to the nozzle body 224 by elongate supports 232. The deflector structure 230 has a deflector structure surface 234. The deflector structure 230 may be displaced a certain distance away from the nozzle outlet 228 and aligned so that a nozzle outlet center axis 229 intersects with the deflector structure 230. The nozzle outlet center axis 229 is an axis through the center of nozzle outlet 228 that may be an axis of radial symmetry for the nozzle outlet 228 and/or the deflector structure 230. The nozzle may be configured so that the deflector structure surface 234 faces the nozzle outlet 228. The nozzle 220 may be made from a ceramic or a metal material. The metal, for example, may be an aluminum, steel, titanium, alloys thereof, or other metals. The ceramic material, for example, may be aluminum oxide, silicon carbide, silicon nitride, or other ceramics.

In one embodiment, depicted in FIG. 2, there are four elongate supports 232 that attach the deflector structure 230 to the nozzle body 224. The embodiment in FIG. 2 is only an example and does not limit the scope of the invention. In some embodiments, there may be fewer than four elongate supports that attach the deflector structure 230 to the nozzle body 224, such as a nozzle 220 with two or three elongate supports. In one particular embodiment, described later herein, a single elongate support may be used. Still, in other embodiments, there may be a nozzle 220 with more than four elongate supports that attach the deflector structure 230 to the nozzle body 224. For the example, the nozzle 220 may have the deflector structure 230 attached to the nozzle body 224 by five, six, seven, or eight elongate supports. These are only examples used to illustrate the present invention. It should also be noted that in the discussion below, that within some of the elongate supports 232 are passages, such as passages 240. The passages may be used to transport fluid that is used to cool the deflector structure 230. In some implementations, each elongate support may have a single passage. In other implementations, a single elongate support may have multiple passages. In still some other implementations, some elongate supports may have a passage or multiple passages while other elongate supports do not have any passages. The discussion below uses embodiments where each elongate support has a passage, but the present invention allows for some elongate supports to not have any passages. Returning to FIGS. 2-1 and 2-2, the nozzle 220 is configured so that the deflector structure 230 is in line with the nozzle outlet center axis 229, with the deflector structure surface 234 facing towards the nozzle outlet 228. In this embodiment, the deflector structure has a conical shape, e.g., a conical frustum 235 that rounds into blunt tip 237. When gas is discharged from the nozzle outlet 228, the gas may hit the deflector structure 230, be diverted to a flow path that is at an oblique angle to the center axis, and disperse evenly around the deflector structure surface 234, following the slope of the deflector structure. The slope of the conical frustum 235 may be used to direct the gas. Thus, the angle of the conical frustum 235 may be changed depending on where the gas is to be directed to. This is discussed further below.

The nozzle 220 may have the capability of cooling components of the nozzle. The nozzle body 224 may have cooling ports 236. The cooling ports 236, which include at least one inlet port and one outlet port, may be used to circulate fluids throughout the nozzle and cool components of the nozzle through convective cooling. For example, the cooling ports 236 may be fluidically connected with passages (not shown in FIG. 2-1, but partially visible in FIG. 2-2) in the elongate supports 232. There may be a hollow interior region (not shown) within the deflector structure 230 that is fluidically connected with the passages in the elongate supports and thus the cooling ports 236. This cooling infrastructure, when fluid is flowed through it, may allow for convective cooling of heated components. In particular, the deflector structure may need to be cooled when plasma is flowed onto the deflector structure surface 234 to prevent thermal damage to the deflector structure 230.

Figure 3:
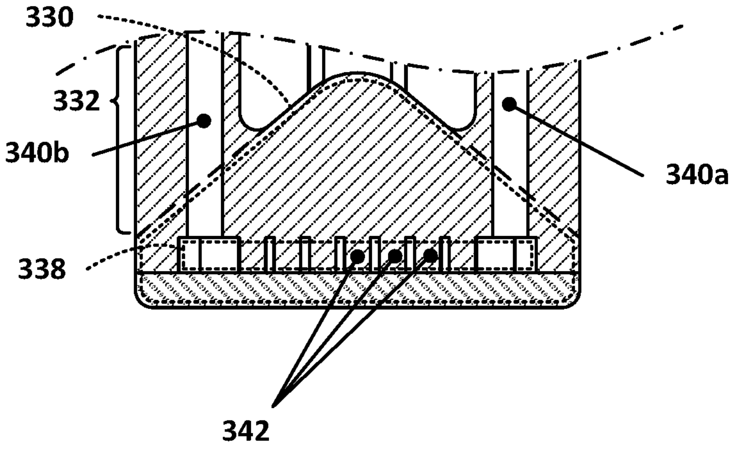
FIG. 3 depicts a section view of the example deflector structure of FIG. 2.
Figure 3:
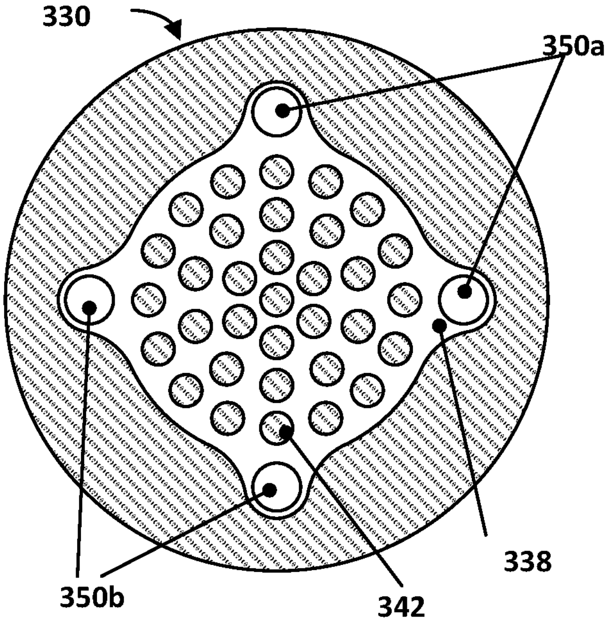

Shown in FIG. 3 are section views of an example of a deflector structure 330 showing a hollow interior region 338 used for cooling the deflector structure. The hollow interior region 338 may be fluidically connected to passages 340 (such as 340*a* and 340*b*) in elongate supports 332 which allow fluids to be flowed through the hollow interior region in order to remove heat that may be transferred into the deflector structure from the plasma that impinges upon the deflector structure surface 234. When the nozzle directs heated plasma onto the deflector structure, the deflector structure may start to heat up. By flowing a fluid through the hollow interior region 338 of the deflector structure 330, the heat will be transferred to the moving fluid, which moves out of the structure through the passage and carries the heat with it.

FIG. 3 has two section views of the interior of the deflector structure 330. The top section view is a side section view of the deflector structure 330 and the bottom section view is a bottom section view of the deflector structure 330. Inside the deflector structure is the hollow interior region 338. In each of the quadrants of the hollow interior region 338 are openings 350 that lead to passages 340*a* or 340*b* inside elongate supports 332. The hollow interior region 338 in this embodiment has a generally round shape with a uniform height. In this embodiment, the hollow interior region 338 has posts 342. Despite having a plurality of posts 342, as shown in the top view, there are multiple paths for fluid to flow from the first set of openings 350*a* through the hollow interior region 338 to the second set of openings 350*b*. In this embodiment, the fluid is not constricted to any single path within the hollow interior region 338.

When the deflector structure 330 becomes heated, the hollow interior region 338 allows fluid to flow through to convectively cool the structure. Heat from the deflector structure surface 334 transfers to the posts 342 in the hollow interior region 338. The posts 342 then transfer the heat to the fluid flowing through the hollow interior region 338. In this configuration, two of the four passages 340*a* flow fluid into the hollow interior region 338 through the first set of openings 350*a*. The second set of openings 350*b* allow fluid to flow out of the hollow interior region 338, through the second set of passages 340*b*, and out of the nozzle. Thus, the configuration allows enough fluid to flow through the hollow interior region 338 and continually remove heat from the deflector structure 330.

Figures 1, 4:
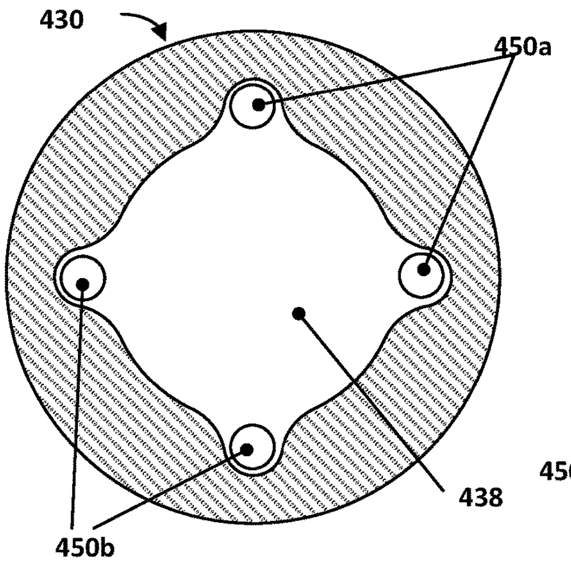
Figures 2, 4:
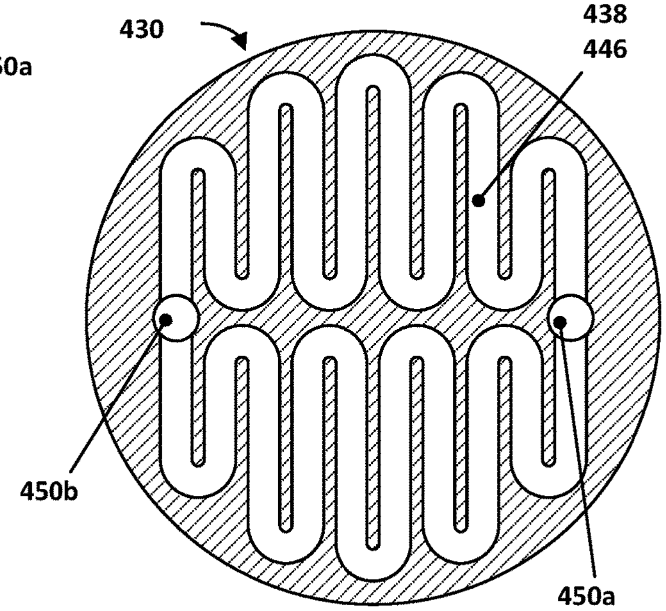
Figures 3, 4:
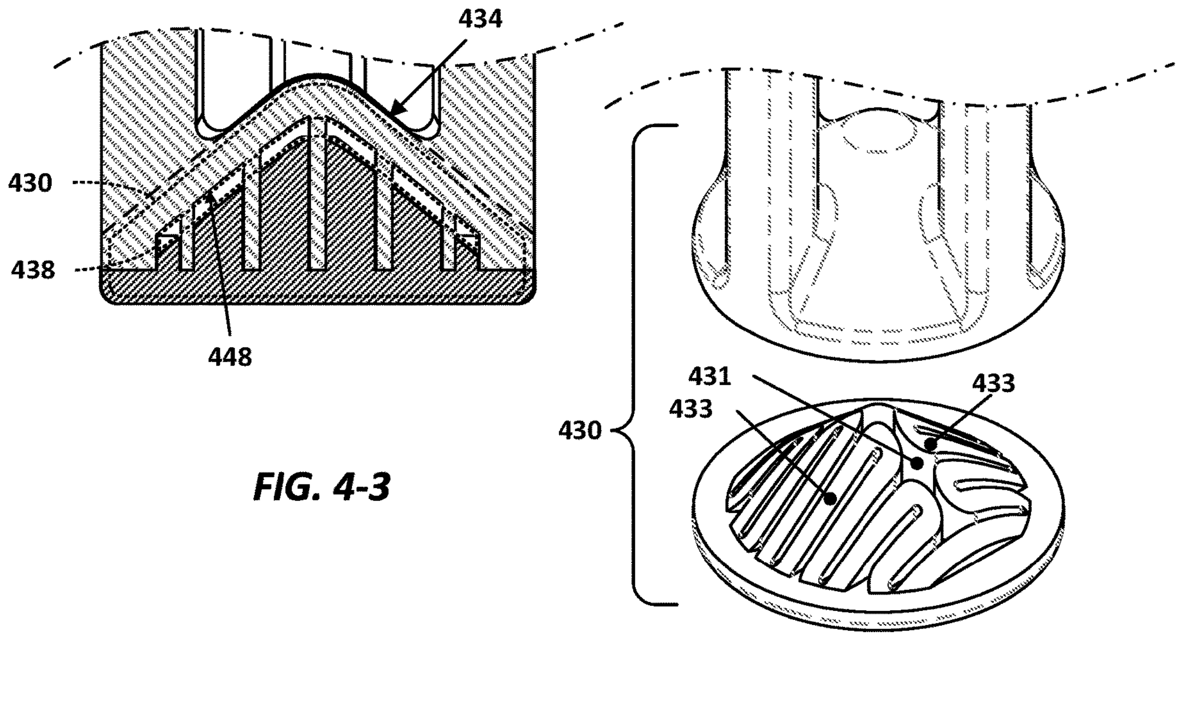

FIGS. 4-1 through 4-3 show examples of alternate embodiments of the interior of a deflector structure 430.

FIG. 4-1 shows a deflector structure 430 with a hollow interior region 438 that is similar to the hollow interior region shown in FIG. 3, with the exception that there are no posts—the hollow interior region 438 is simply a single, open cavity. There are openings 450 that fluidically connect passages (not shown) in the elongate structures (not shown) to the hollow interior region 438. In this example, when the deflector structure becomes heated, the fluid may flow through the hollow interior region 438 to remove the heat through convection. The heat is transferred from the deflector structure surface (not shown) to the top interior surface of the hollow interior region 438. The fluid is flown through a first set of passages through the first set of openings 450*a* into the hollow interior region, where the heat may be transferred from the deflector structure 430 to the flowing fluid via the top interior surface. The heated fluid may then be transferred out through a second set of openings 450*b* into a second set of passages and out of the nozzle.

FIG. 4-2 depicts another example hollow interior region 438 that may be provided inside the deflector structure 430. This example, unlike the previous examples, has two serpentine passages 446 in the hollow interior region instead of a single, open chamber, thereby constraining the fluid flow through the hollow interior region 438 to a particular flow path or paths. In the example shown, there are two openings 450 where passages in the elongate supports may fluidically connect to the serpentine passages 446. The fluid is flowed through the opening 450*a* fluidically connected to the inlet to the serpentine passages 446 where it diverges between two the two serpentine passages 446. The fluids from each of the serpentine passages 446 merge into a single passage that connects to the opening 450*b*, which serves as an outlet for the serpentine passages 446. Thus, the fluid used to cool the deflector structure 430 is constricted to one of two paths when travelling through the deflector structure 330.

FIG. 4-3 depicts another example of a hollow interior region 438 inside the deflector structure 430. In FIG. 4-3, the hollow interior region 438 has two serpentine passages, similar to those in FIG. 4-2, but the passages follow a three-dimensional serpentine path instead of a two-dimensional serpentine path. This allows a top interior surface 448 of the hollow interior region 438 to follow the shape of the deflector structure surface 434, thus creating a generally uniform thickness of material between the deflector structure surface and the top interior surface 448 of the hollow interior region 438, which is thinner than its counterpart shown in FIG. 3. Having less material between the deflector structure surface 434 and the hollow interior region 438 may allow for a faster heat transfer from the deflector structure surface 434 to the flowing fluid in the hollow interior region 438, thus potentially leading to a more efficient cooling of the deflector structure 430. As can also be seen in FIG. 4-3, in some embodiments, the surface of the hollow interior region 438 that faces towards the top interior surface 448 (which may be thought of as the bottom interior surface of the hollow interior region 438) may be similarly contoured so as to keep the height or thickness of the hollow interior region 438, and thus the serpentine passages, relatively uniform across the hollow interior region 438. This may help prevent stagnation in the fluid flow while still allowing the fluid to flow close to the deflector structure surface 434. The view at right in FIG. 4-3 is an exploded view of the deflector structure 430 showing the bottom portion (indicated by dense cross-hatching in the section view of FIG. 4-3) removed from the remainder of the deflector structure 430. As can be seen, two serpentine wall features 431 are provided that have uppermost surfaces that may define the interior bottom surface 433 of the hollow interior region 438 when the wall structures are inserted into matching serpentine passages that may be machined in the underside of the remainder of the deflector structure 430. It will also be recognized that such a geometry may be obtained in a unitary deflector structure 430, e.g., one that is manufactured using additive manufacturing processes, such as direct laser metal sintering. It will be appreciated that the hollow interior regions with posts or unobstructed cavities may also be constructed in a similar manner, e.g., with a top interior surface—and potentially a bottom interior surface—that have profiles similar to the deflector structure surface.

Figure 5:
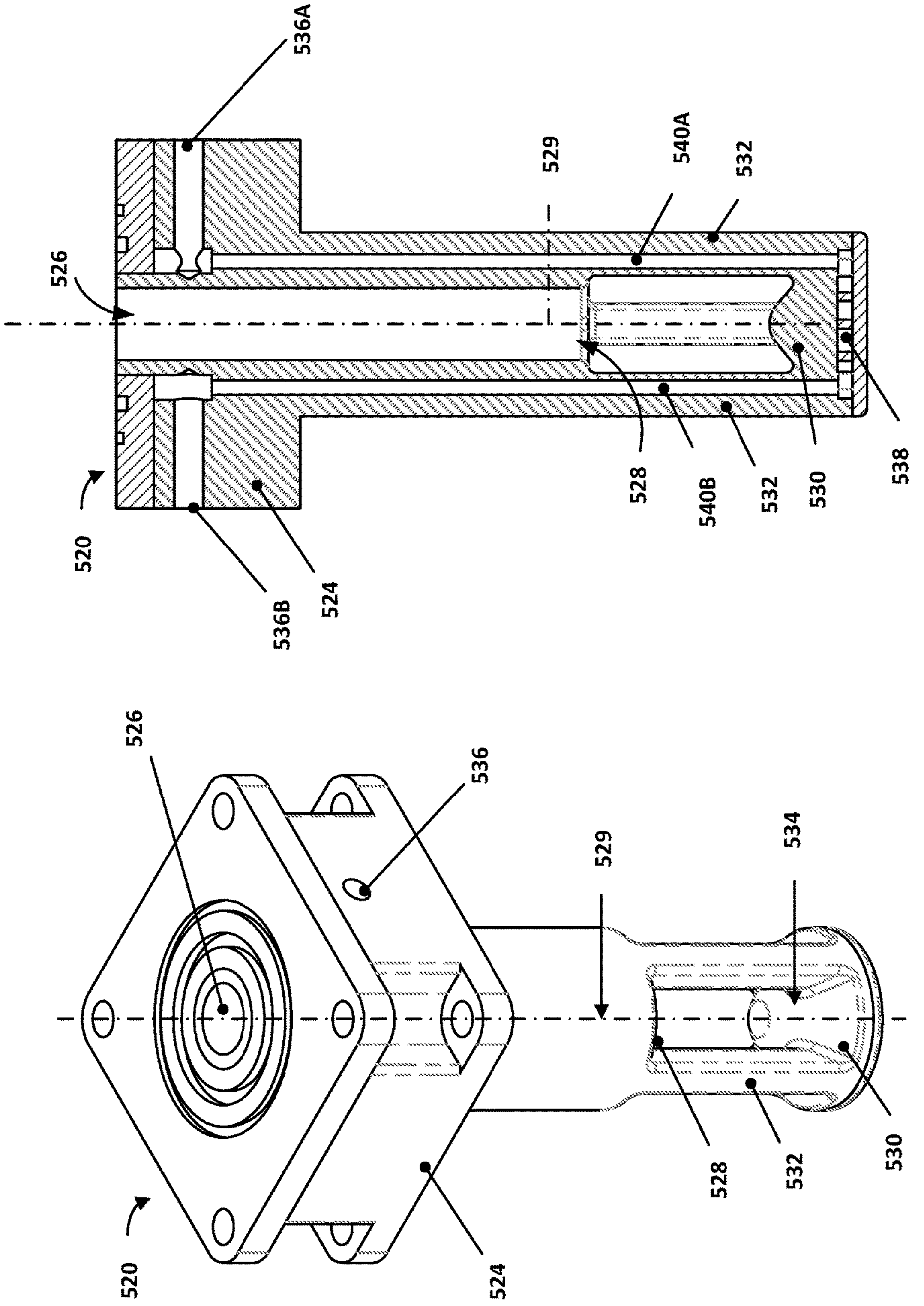
FIG. 5 depicts a perspective view and a side section view of the example nozzle discussed in FIG. 2

Depicted in FIG. 5 is an example of a nozzle 520 with a four elongate support configuration. The elongate supports 532 have two primary purposes: to attach the deflector structure 530 to the nozzle 520 and to carry fluid from cooling ports 536 to a hollow interior region 538 of the deflector structure 530 and back out to a second convection fluid port.

The first view is an isometric view of the nozzle 520. At the top is the nozzle inlet 526. Shown on one side is a cooling port 536 used to flow fluids for cooling the nozzle. There are four elongate supports 532 which attach the deflector structure 530 to the nozzle body 524. The elongate supports 532 are arranged around the center axis 529 of the nozzle outlet 528 in a radially symmetric manner and spaced equidistantly apart.

The figure on the right shows a section view of the same nozzle 520. At the top is the nozzle inlet 526 fluidically connected to the nozzle outlet 528 directly below. Shown in the section view are the two cooling ports 536A and 536B. Below the cooling ports 536 are the elongate supports 532 which attach the deflector structure 530 to the nozzle 520. Shown in the figure are three of the four elongate supports. Within each elongate support are passages 540. The passages are each fluidically connected to and fluidically interposed between one of the cooling ports 536 and the hollow interior region 538. Passage 540A is fluidically interposed between the first cooling port 536A and the hollow interior region. Passage 540B is fluidically interposed between the second cooling port 536B and the hollow interior region 538.

When the cooling is activated for the nozzle 520, a cooling fluid, such as water or perfluoropolyether fluorinated fluid (e.g., Galden PFPE by Solvay, Inc.), enters into the nozzle via the first cooling port 536A. In this example, the first cooling port 536A is fluidically connected to a first set of two passages, only one of which is shown (540A). The fluid travels down the two passages into the chamber. Any heat on the deflector structure surface 534 may be transferred to the fluid flowing through the chamber. The heated fluid may be pushed out of the chamber as additional fluid is supplied to the nozzle 520 via the first cooling port 536A. The fluid travels up a second set of two passages, only one of which is shown (540B), to the second cooling port 536B where it exits the nozzle 520. It should be noted that the cooling within the nozzle can work in reverse. That is, the fluid enters the nozzle 520 through the second cooling port 536B, down the second set of passages 540B, back through the chamber 544, up through the first set of passages 540A, and finally out of the first cooling port 536A.

Figure 6:
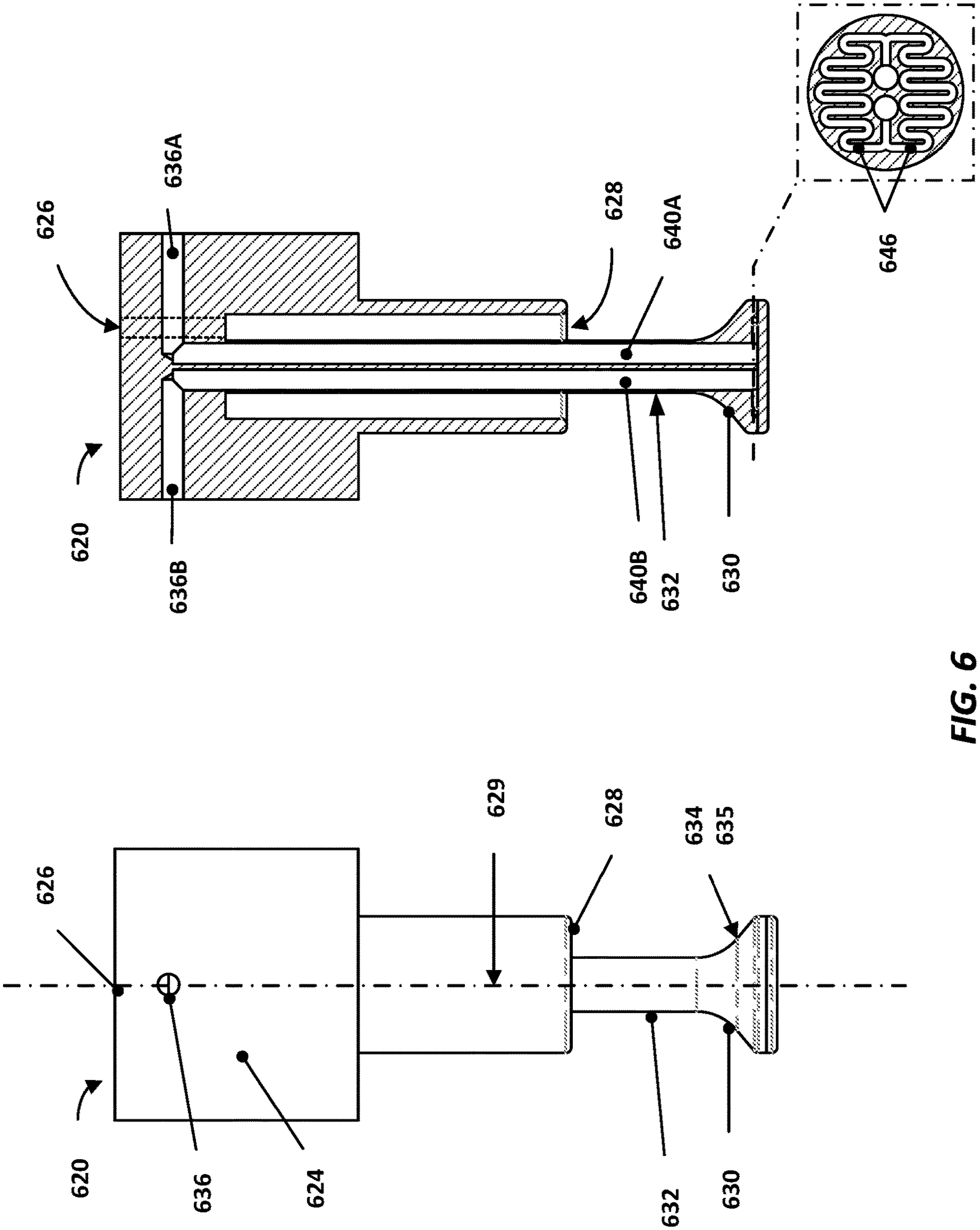
FIG. 6 depicts a perspective view and a side section view of a nozzle that is an example of the nozzles discussed herein.

A second embodiment of a nozzle 620 is shown in FIG. 6. In this embodiment, nozzle 620 is configured to have a single elongate support 632 attach the deflector structure 630 to the nozzle body 624. The nozzle 620 has a nozzle inlet 626 fluidically connected to the nozzle outlet 628. The single elongate support 632 is concentric with the nozzle outlet 628. The single elongate support 632 connects through the top of the deflector structure 630 to the nozzle body 624 through the nozzle inlet 626. The deflector structure surface

634 has a conical frustum 635 shape. The deflector structure surface 634 gradually morphs into the elongate support 632. On the nozzle body 624 are two cooling ports 636 fluidically connected to the passages in the single elongate support.

In some instances, a nozzle 620 with a single elongate support 632 may be desirable—for example, such an arrangement may produce a more axially symmetric flow of gas than may be achieved with multiple elongate supports distributed around the perimeter of the nozzle outlet. The single elongate support may be located along the center axis, thereby potentially acting to distribute the collimated flow of the plasma over a larger annular area as opposed to focusing the flow on the centermost portion of the deflector structure. This may reduce the potential concentration of heat on any one single point of the deflector structure 630.

Figure 7:
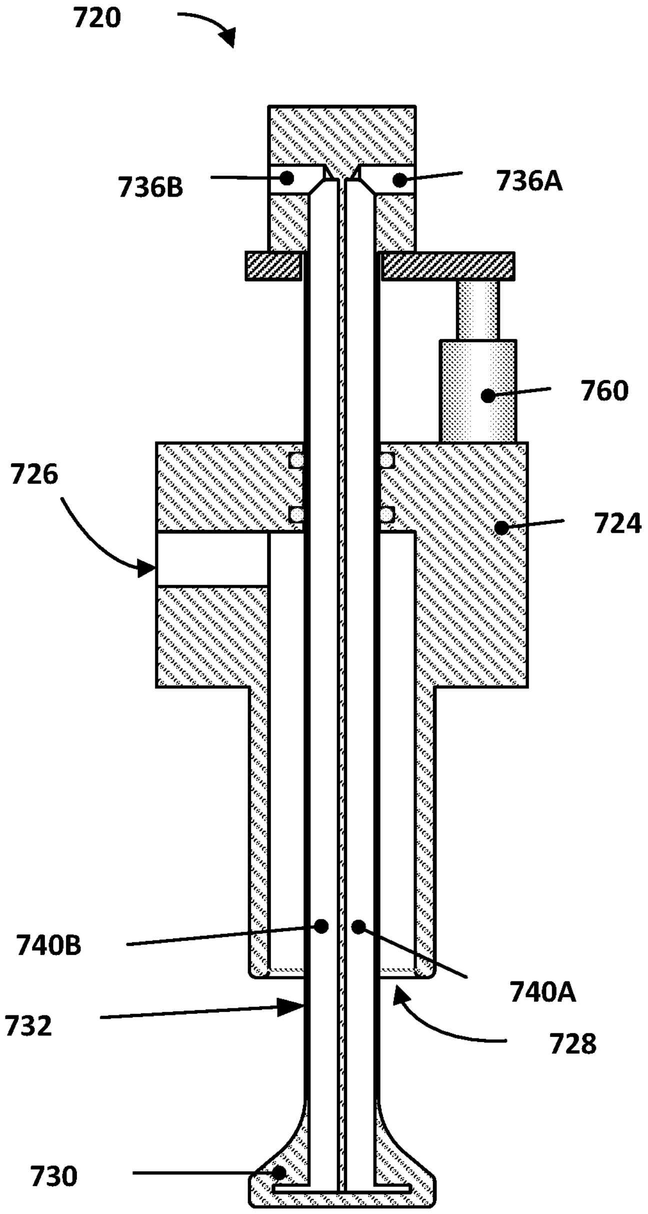
FIG. 7 depicts a side section view of a nozzle that is an example of the nozzle discussed herein.

In some instances, as shown in FIG. 7, a nozzle 720 with a single elongate support 732 may be attached to the nozzle body 724 by an actuator 760; the elongate support 732 may be slidably engaged with the nozzle body 724, e.g., via a sliding interface with O-rings (as shown) or other seals, e.g., a bellows seal, to provide a gas-tight seal but allow for sliding motion between the elongate support 732 and the nozzle body 724. Cooling fluid may be circulated through the deflector structure via cooling ports 736A and 736B and passages 740A and 740B. Plasma may be provided to the nozzle 720 through nozzle inlet 726 and flowed out of the nozzle 720 through nozzle outlet 728, at which point the deflector structure 730 may cause the plasma flow to travel radially outward. The actuator 760 may be a linear actuator or a piston and used to control the location of a deflector structure 730 at the distal end of the elongate support 732. The actuator 760 may extend the deflector structure 730 away from the nozzle body 724 or retract the deflector structure 730 towards the nozzle body 724. This may be used to optimize the deflector structure's position in a chamber and potentially optimize or change the flow path of plasma within the chamber to better distribute the plasma throughout the chamber.

Returning to FIG. 6, shown on the right is a sectional view of the nozzle 620; an inset section view is also provided at lower right to show the hollow interior region of the deflector structure. The sectional view shows the two cooling ports 636A and 636B on either side. The cooling ports 636 are fluidically connected to the passages 640, with cooling port 636A connected to passage 640A and cooling port 636B connected to passage 640B. Both passages are in the single elongate support 632 which is concentric with the nozzle outlet 628. The single elongate support 632 is attached to the deflector structure 630. Inside the deflector structure is a hollow interior region 638, which, in this case is a passage 646. The passage is fluidically connected and fluidically interposed between the two passages, passage 640A and passage 640B.

When the nozzle 620 is in operation, a plasma clean gas source is fluidically connected to the nozzle 620 via the nozzle inlet 626 (there may also be multiple nozzle inlets 626). The generated plasma enters through the nozzle inlet 626 inlet, travels through the nozzle body 624, and out through the nozzle outlet 628. The gas flows downward along the elongate support 632 to the deflector structure 630. The plasma may heat the deflector structure 630 and/or the elongate support 632 but is deflected radially outwards at an angle by the deflector structure, resulting in a generally axisymmetric flow of plasma. Similar to the embodiment in FIG. 5, the cooling system in FIG. 6 may be activated to keep both the deflector structure and/or the elongate support cool. When the nozzle uses the cooling system, a fluid is delivered to the nozzle via one of the cooling ports 636. As discussed above, the fluid may flow in either direction and is not constrained to a single direction. In this example, the fluid is delivered to the nozzle via the cooling port 636A. The fluid flows through the nozzle and connects to the cooling passage 640A. As the elongate structure is heated, heat transfer may start from the structure to the fluid. The fluid continues along the path to the deflector structure passages 646. The fluid will follow the path of the passage through the deflector structure 630. While flowing through the path, heat from the deflector structure surface 634 may be transferred to the fluid. The fluid is then flowed out to the second passage 640B in the single elongate structure and out through the second cooling port 636B.

Figure 8:
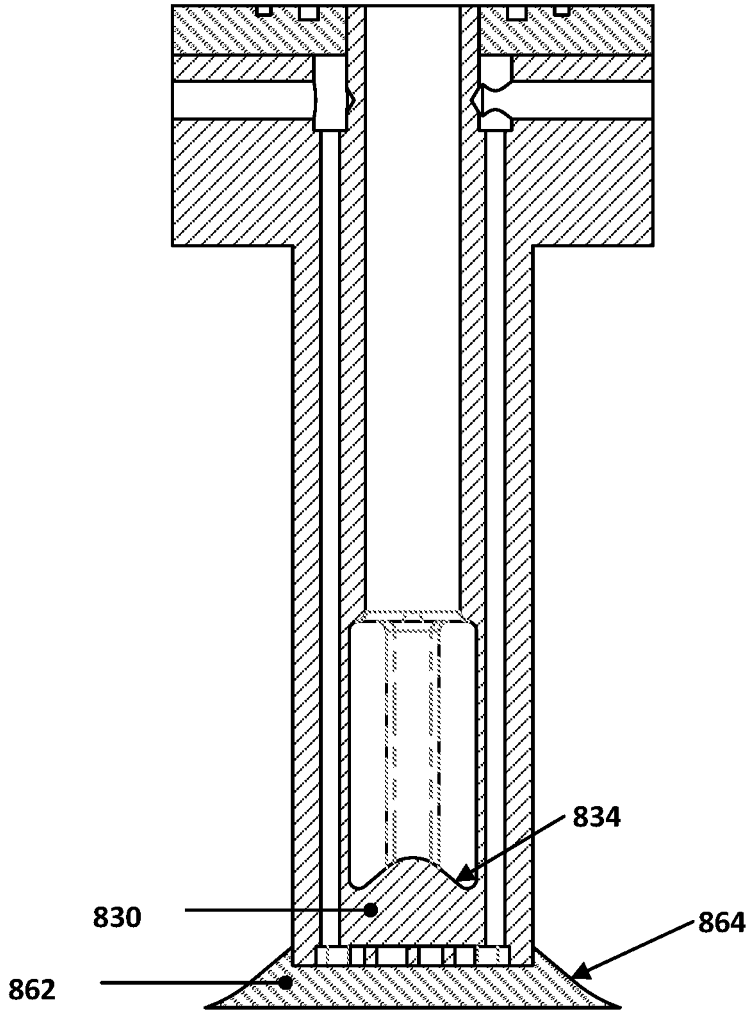
FIG. 8 depicts an example of a deflector extension surface attached to a deflector structure that is an example of the deflector structures discussed.

FIG. 8 shows a deflector structure 830 with a deflector extension structure 862. The deflector extension structure 862 has an extension surface 864. The deflector extension structure 862 may be attached to the deflector structure 830 so that the extension surface 864 connects with the deflector structure surface 834 to form a single continuous surface. The extension surface 864 may be shaped according to the configuration of the chamber. In some embodiments the extension surface 864 may be a single flat surface. In the example shown in FIG. 8, the extension surface 864 is a conical surface that continues the deflector structure surface 834 and that then transitions to a concave surface of revolution at a point further from the center axis. In another embodiment, the extension surface 864 may simply be a conical surface without a concave portion as shown. The concave extension surface 864 may be used to direct the plasma flow into areas that are further from the center of a chamber.

While the above discussion above has focused on different implementations of the nozzles, the various nozzles discussed above may be used in a generally similar manner, e.g., consistent with the discussion below.

Figure 9:
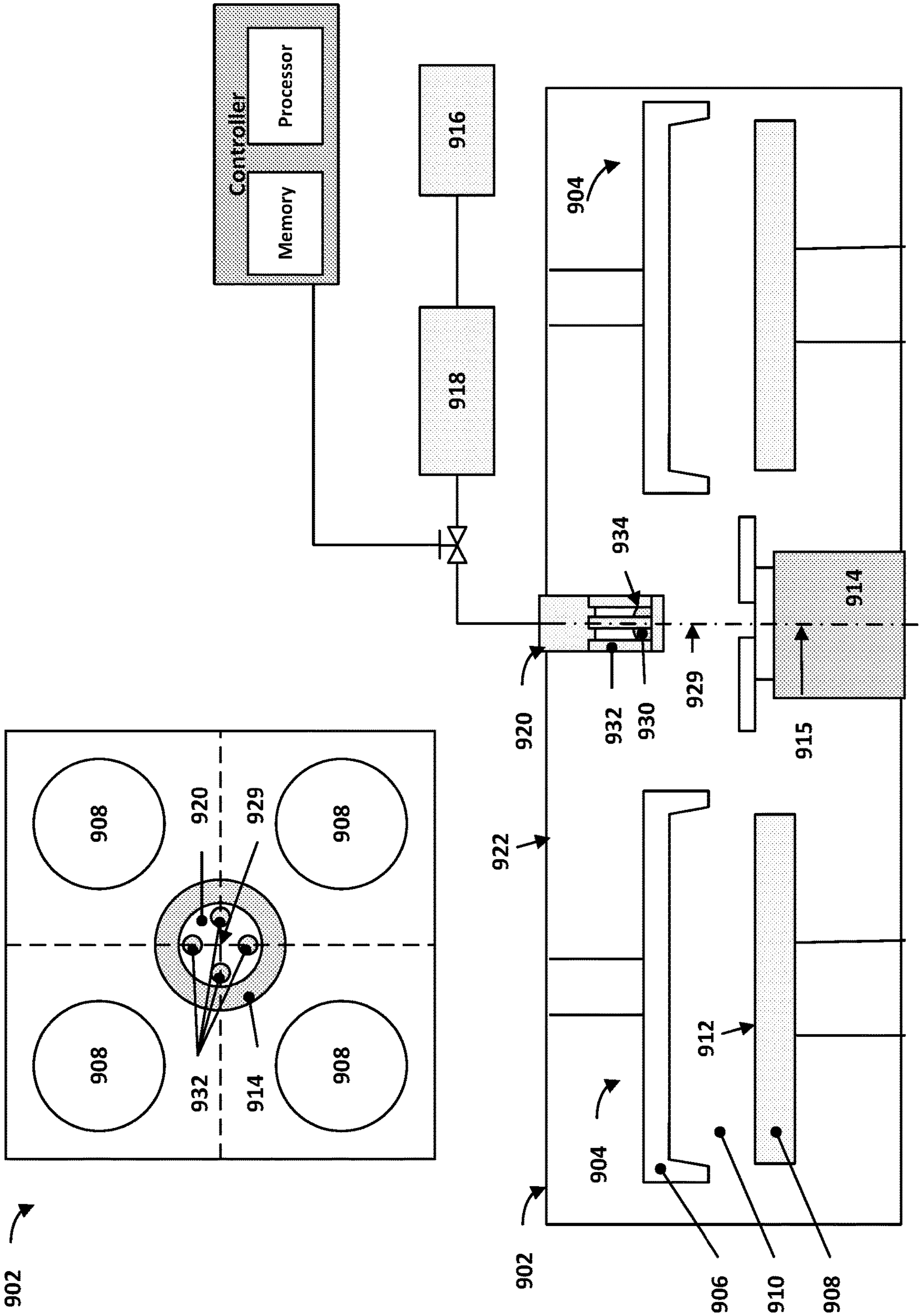
FIG. 9 depicts a side view of part of an example semiconductor processing tool having a nozzle that is an example of the nozzles discussed.

FIG. 9 shows a top view and side view of a chamber 902 with a nozzle 920 having a deflector structure 930 and four elongate supports 932 in it. In this embodiment, the nozzle 920 is mounted to a chamber lid 922 at the top of the chamber. Inside the chamber is an indexer 914 and four wafer processing stations 904. The indexer 914 is positioned directly below the nozzle 920 so that the indexer's center axis 915 is in line with the nozzle outlet center axis 929. The four wafer processing stations 904 are arranged in a circular array around the indexer's center axis 915 in the process chamber. Each wafer processing station 904 has a showerhead 906 and a pedestal 908, with each pedestal having a substrate support surface 912. As shown in the top view, the four elongate supports 932 of the nozzle 920 are positioned so that a reference line from the nozzle outlet center axis 929 through the elongate support 932 does not intersect with any part of the pedestal 908. The wafer processing area 910 is the area from the substrate support surface 912 up to the showerhead 906. Moving back to the nozzle 920, the nozzle is in fluidic connection with gas source 916 and the plasma generator 918. The plasma generator is fluidically interposed between the gas source 916 and nozzle 920.

When the chamber is cleaned by remote plasma clean process, the gas source 916 supplies a gas to the plasma generator 918, where the gas is energized, creating a plasma that may be at a high temperature, e.g. above 300° C. The plasma is sent to the nozzle 920, where it is flowed into the chamber 902. The nozzle outlet may eject the plasma at a high velocity in a highly collimated flow. The plasma may hit the deflector structure surface 934 instead of any existing hardware in the chamber 902. By hitting the deflector structure surface 934, the velocity of the plasma will be reduced, and the gas will disperse throughout the chamber 902. The plasma may follow the slope of the deflector structure surface 934. In some embodiments, the slope of the deflector structure surface 934 may lead the plasma so that it travels along the surface and towards the edge of the indexer 914. By the time the gas makes contact with the indexer 914, the plasma will be diffused, reducing the heat on the indexer. The indexer 914 may redirect the flow of the diffused plasma into the wafer processing areas 910 to clean out the wafer processing stations 904. In other embodiments, the slope may direct the plasma so that it travels directly to the substrate support surfaces 912 of the wafer processing stations 904 and directly into the wafer processing area 910 after making contact with the deflector structure 930. The slope of the deflector structure surface 934 may be changed to optimize the remote plasma cleaning process depending on multiple variables, including the configuration of the chamber 902.

As the nozzle 920 flows the plasma into the chamber, the nozzle may use its cooling system to convection cool the nozzle. The nozzle 920 may be fluidically connected to a cooling fluid used to convection cool the nozzle. In this example, the nozzle has four elongate supports 932. The cooling fluid is flowed through a cooling port (not shown), down through a first set of passages, each in its own elongate support 932, through a hollow interior region of the deflector structure 930, up through a second set of passages, each in its own elongate support, and out through a second cooling port. When the deflector structure is heated by the ejected plasma, the deflector structure may transfer heat from the deflector structure surface to the flowing fluid moving through the hollow interior region. The flowing fluid is able to remove the heat as it travels out of the nozzle, thus cooling the deflector structure and the nozzle.

Figure 10:
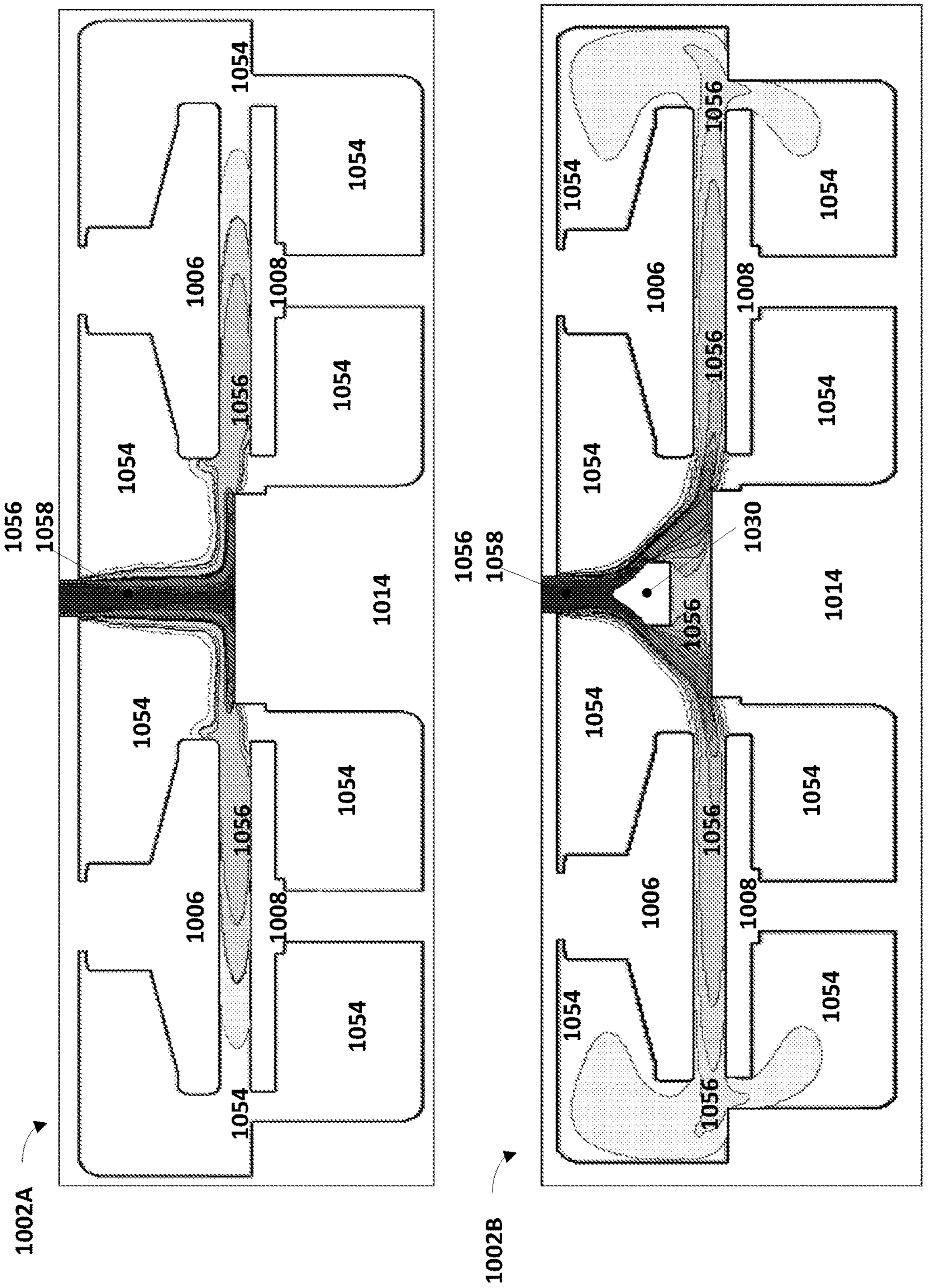
FIG. 10 compares simulations of process gas flowing inside part of an example semiconductor processing chamber having no deflector structure with an example semiconductor processing chamber having an example deflector structure of FIG. 2.

FIG. 10 shows a plasma 1056 clean in a process chamber 1002 with two different nozzles. On the top, the process chamber 1002A has plasma 1056 flow in from a nozzle without a deflector structure. On the bottom, the process chamber 1002B has plasma 1056 flow in from a nozzle with a deflector structure 1030. In each process chamber 1002, there is an indexer 1014, pedestals 1008, and showerheads 1006. The mole fraction of oxygen radicals in the plasma flow is represented by the greyscale shading that is used in FIG. 10; the darker the shading, the higher the mole fraction. The oxygen radicals react with the surfaces that the plasma is directed over, thereby reducing the amount of oxygen radicals that is available to perform cleaning operations as the plasma flows radially outward from the chamber center. The concentration of oxygen radicals also generally correlates with the amount of heat that is applied to various surfaces of the chamber, e.g., at higher concentrations, more heat is applied.

In the example shown at the top of FIG. 10, a nozzle without a deflector structure flows the plasma 1056 into the process chamber 1002A by an intense collimated flow 1058. The intense collimated flow 1058 flows from the nozzle unobstructed to the top of indexer 1014, subjecting the indexer to high heat and potential damage. Once the collimated flow 1056 hits the indexer 1014, the plasma 1056 moves into the process area between the showerhead 1006 and the pedestal 1008. In this example, the mole fraction of oxygen radicals in the plasma 1056 that reaches the outermost periphery of the wafer processing stations is not high enough to effectively clean those outermost surfaces, potentially leaving parts of the wafer processing station, as well as the interior walls of the process chamber 1002A, unclean.

In the example shown at the bottom of FIG. 10, a nozzle with a deflector structure 1030 flows plasma 1056 into a process chamber 1002B. The flow of the plasma 1056 is initially an intense collimated flow 1058. In this example, the collimated flow 1058 hits the deflector structure 1030, which acts to divert the collimated flow into a generally conical flow, thereby reducing the intensity of the flow. The surface of the deflector structure 1030 is angled so that a line tangential to the surface would intersect, or come close to intersecting, with an edge of the hub of the indexer 1014, thus distributing the plasma near the outer edge of the indexer hub. The plasma 1056 hits the edge, or near the edge, of the indexer 1014 before being dispersed into the wafer processing areas between the showerheads 1006 and the pedestals 1008. In this case, the plasma 1056 is more effectively distributed by the deflector structure such that plasma with an effective mole fraction of oxygen radicals is able to make it through the entire processing area to the inner walls of the processing chamber 1002B. The plasma 1056 is also able to flow back under the deflector structure and clean the top center surfaces of the indexer 1014. By using the nozzle with a deflector structure 1030, the plasma 1056 may be able to clean more places within the process chamber 1002B, in addition to reducing the amount of heating that may be experienced by components directly underneath the nozzle.

In some implementations, a controller may be used in a system that incorporates the nozzles discussed herein. FIG. 9 depicts a schematic of an example controller with one or more processors and a memory, which may be integrated with electronics for controlling the operation of valves and/or a plasma generator to allow the flow of plasma to the nozzle 920. The controller, depending on the processing requirements and/or the type of system, may be programmed to control any of the processes disclosed herein, such as processes for controlling the flow of plasma and/or cooling fluid, as well as other processes or parameters not discussed herein, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a chamber and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example rotational indexers according to the present disclosure may be mounted in or part of semiconductor processing tools with a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

For the purposes of this disclosure, the term "fluidically connected" is used with respect to volumes, plenums, holes, etc., that may be connected with one another, either directly or via one or more intervening components or volumes, in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, the term "set" or "subset" should not be viewed, in itself, as necessarily encompassing a plurality of items—it will be understood that a set or a subset can encompass only one member or multiple members (unless the context indicates otherwise).

Although the foregoing embodiments have been described in some detail for purposes of clarity of understanding, it will be apparent that certain changes and modifications may be practiced within the scope of the appended claims. It should be noted that there are many alternative ways of implementing the system and apparatus of the present embodiments. Accordingly, the present embodiments are to be considered as illustrative and not restrictive, and the embodiments are not to be limited to the details given herein.

What is claimed is:

1. An apparatus comprising:

a nozzle body having a nozzle outlet;

a deflector structure; and one or more elongate supports, wherein:

- the one or more elongate supports support the deflector structure relative to the nozzle body,
- the deflector structure has a deflection surface facing the nozzle outlet,
- a center axis of the nozzle outlet intersects with the deflection surface,
- a first cooling passage extends through at least one of the one or more elongate supports,
- a second cooling passage extends through at least one of the one or more elongate supports,
- the deflector structure has one or more hollow interior regions that are fluidically connected with, and fluidically interposed between, the first cooling passage and the second cooling passage.

2. The apparatus of claim 1, wherein the deflection surface includes, at least in part, a conical frustum surface.

3. The apparatus of claim 2, wherein the conical frustum surface is axially symmetric about the center axis of the nozzle outlet.

4. The apparatus of claim 2, wherein the one or more hollow interior regions are bounded in part by an interior surface of the deflector structure that is offset from the deflection surface so that the closest distance between the deflection surface and the interior surface at points distributed across the interior surface is substantially the same.

5. The apparatus of claim 1, wherein the one or more hollow interior regions include one or more passages that are each fluidically connected with, and fluidically interposed between, the first cooling passage and the second cooling passage.

6. The apparatus of claim 5, wherein the one or more passages follow a serpentine path between the first cooling passage and the second cooling passage.

7. The apparatus of claim 1, wherein the one or more hollow interior regions includes a hollow interior region with a substantially circular cross-sectional shape in a plane perpendicular to the center axis.

8. The apparatus of claim 1, wherein at least one of the one or more hollow interior regions has a plurality of posts within it and each post connects to a first interior surface of the hollow interior region.

9. The apparatus of claim 1, wherein:

the one or more elongate supports includes a first elongate support and a second elongate support, the first cooling passage is in the first elongate support, and the second cooling passage is in the second elongated support.

10. The apparatus of claim 1, wherein:

there is only a single elongate support, the first cooling passage and the second cooling passage are in the single elongate support, and the single elongate support is centered on the center nozzle axis.

11. The apparatus of claim 1, further comprising:

a process chamber;

a plurality of semiconductor wafer processing stations; and an indexer; wherein:

the semiconductor wafer processing stations are located within the process chamber, the nozzle body is supported by a top cover of the process chamber and configured so that the nozzle outlet and deflector structure are located within the process chamber, the deflector structure is located above the indexer through a center axis of the process chamber that intersects with the top cover of the process chamber, and each of the wafer processing stations is arranged in the process chamber around the nozzle outlet, the wafer processing stations each have a corresponding pedestal and a corresponding showerhead, each pedestal has a corresponding substrate support surface configured to support a semiconductor wafer when the semiconductor wafer is placed thereupon, and each showerhead is positioned above the corresponding pedestal and configured to distribute gases flowed therethrough towards the corresponding pedestal.

12. The apparatus of claim 11, wherein the indexer is mounted so that at least part of the indexer is within a central area of the chamber as viewed from above.

13. The apparatus of claim 1, wherein the one or more elongate supports includes a first elongate support, a second elongate support, a third elongate support, and a fourth elongate support.

14. The apparatus of claim 13, wherein each of the four elongate supports are a first distance from the center axis and each elongate support is equidistant from each nearest elongate support.

15. The apparatus of claims 13, further comprising a third cooling passage and a fourth cooling passage, wherein:

the first cooling passage is in the first elongate support, the second cooling passage is in the second elongate support, the third cooling passage is in the third elongate support, the fourth cooling passage is in the fourth elongate support, and the third cooling passage and the fourth cooling passage are fluidically connected to one of the one or more hollow interior regions of the deflector structure.

16. The apparatus of claim 11, wherein the nozzle body is oriented such that each elongate support lies along a corresponding reference axis that intersects the center axis of the nozzle outlet and does not overlap with any of the wafer stations when viewed from above.

17. The apparatus of claim 11, wherein: the deflection surface includes, at least in part, a conical frustum surface; and a reference axis passing through the center axis and coincident with the conical frustum surface comes within 3 inches of any portion of a center hub of the indexer.

18. The apparatus of claim 11, wherein: the deflection surface includes, at least in part, a conical frustum surface; and a reference axis passing through the center axis and coincident with the conical frustum surface intersects with the substrate support surface of one of the wafer processing stations and does not intersect with the showerhead of one of the wafer processing stations.

19. The apparatus of claim 1, wherein the elongate supports and deflector structure fit within a cylindrical envelope that is centered on the center axis and has an outer diameter that is no larger than a maximum dimension of the nozzle body at the nozzle outlet and transverse to the center axis.

20. The apparatus of claim 1, further comprising a deflector extension structure having an extension surface, wherein the deflector extension structure is attached to the deflector structure so that the extension surface aligns with the deflection surface to form a single continuous surface.

* * * * *